(12) United States Patent
Moritomo et al.

(10) Patent No.: US 6,887,513 B2
(45) Date of Patent: May 3, 2005

(54) METHOD FOR FABRICATING A MAGNETORESISTIVE FILM AND MAGNETORESISTIVE FILM

(75) Inventors: Yutaka Moritomo, Nagoya (JP); Xiaojun Liu, Nagoya (JP)

(73) Assignee: Nagoya University, Nagoya (JP)

( * ) Notice: Subject to any disclaimer, the term of this patent is extended or adjusted under 35 U.S.C. 154(b) by 65 days.

(21) Appl. No.: 10/346,027

(22) Filed: Jan. 17, 2003

(65) Prior Publication Data

US 2003/0170484 A1 Sep. 11, 2003

(30) Foreign Application Priority Data

Feb. 12, 2002 (JP) .................................... 2002-034057

(51) Int. Cl.$^7$ .............................................. B05D 3/04
(52) U.S. Cl. ..................... 427/130; 427/377; 427/383.3
(58) Field of Search ............................ 427/130, 383.3, 427/377

(56) References Cited

U.S. PATENT DOCUMENTS

| | | | |
|---|---|---|---|
| 5,106,827 A | * | 4/1992 | Borden et al. ............... 505/480 |
| 6,040,070 A | * | 3/2000 | Szot et al. .................. 428/700 |
| 6,194,228 B1 | * | 2/2001 | Fujiki et al. .................... 438/3 |
| 6,432,474 B1 | * | 8/2002 | Nakanishi et al. ........ 427/126.3 |

FOREIGN PATENT DOCUMENTS

| | | |
|---|---|---|
| JP | A 2000-357828 | 12/2000 |
| JP | A 2001-28317 | 1/2001 |

OTHER PUBLICATIONS

J. Navarro et al.; "Raising the Curie Temperature in $Sr_2FeMoO_6$ Double Perovskites by Electron Doping"; Physical Review B, vol. 64; Aug. 15, 2001; pp. 092411-1 to 092411-4.

D. Niebieskikwiat et al.; "High-Temperature Properties of the $SR_2FeMoO_6$ Double Perovskite: Electrical Resistivity, Magnetic Susceptibility, and ESR"; Physical Review B, vol. 62 No. 5; Aug. 1, 2000; pp. 3340–3343.

Y. Tomioka et al.; "Magnetic and Electronic Properties of a Single Crystal of Ordered Double Perovskite $Sr_2FeMoO_6$"; Physical Review B, vol. 61, No. 1; Jan. 1, 2000; pp. 422–425.

Yutaka Moritomo et al.; "Fe–Site Substitution Effects on Conductive Ferromagnet $Sr_2FeMoO_6$"; Journal of the Physical Society of Japan, vol. 70, No. 10; Oct. 2001; pp. 3182–3183.

Y. Moritomo et al.; "Electronic Structure of Double–Perovskite Transition–Metal Oxides", Physical Review B, Third Series, vol. 61, No. 12; Mar. 15, 2000; pp. R7827–R7830.

Y. Moritomo et al.; "Electron Doping Effects in Conducting $Sr_2FeMoO_6$"; Physical Review B, vol. 62, No. 21; Dec. 1, 2000; pp. 14224–14227.

Yutaka Moritomo et al.; "Crystal and Magnetic Structure of Conducting Double Perovskite $Sr_2FeMoO_6$"; Journal of the Physical Society of Japan, vol. 69, No. 6; Jun. 2000; pp. 1723–1726.

H. Yanagihara et al.; "Magnetotransport in Double Perovskite $Sr_2FeMoO_2$: Role of Magnetic and Nonmagnetic Disorder"; Physical Review B, vol. 64; Nov. 1, 2001; pp. 214407-1 to 214407-4.

Takashi Manako et al.; "Epitaxial Thin Films of Ordered Double Perovskite $Sr_2FeMo\,O_6$"; Applied Physics Letters, vol. 74, No. 15; Apr. 12, 1999; pp. 2215–2217.

W. Westerburg et al.; "Expitaxy and Magnetotransport of $Sr_2FeMoO_6$ Thin Films"; Physical Review B, vol. 62, No. 2; Jul. 1, 2000; pp. R767–R770.

R.I. Dass et al.; "Itinerant to Localized Electronic Transistion in $Sr_2FeMo_{1-x}W_xO_6$"; Physical Review B, vol. 63; Jan. 22, 2001; pp. 064417-1 to 064417-8.

D.D. Sarma et al.; "Magnetoresistance in Ordered and Disordered Double Perovskite Oxide, $Sr_2FeMoO_6$"; Solid State Communications, Jan. 2000; pp. 465–468.

K.–I. Kobayashi et al.; "Integrain Tunneling Magnetoresistance in Polycrystals of the Ordered Double Perovskite $Sr_2FeReO_6$"; Physical Review B, vol. 59, No. 17; May 1, 1999; pp. 11159–11162.

T. H. Kim et al.; "Large Room–Temperature Intergrain Magnetoresistance in Double Perovskite $SrFe_{1-x}(Mo$ OR $Re)_xO_3$"; Applied Physics Letters, vol. 74, No. 12, Mar. 22, 1999; pp. 1737–1739.

* cited by examiner

*Primary Examiner*—Kirsten Jolley
(74) *Attorney, Agent, or Firm*—Oliff & Berridge, PLC

(57) ABSTRACT

A double perovskite type oxide film is formed on a given single crystalline substrate. Then, the oxide film in set in an oxygen-including atmosphere, thereby to be oxidized. As a result, oxygen is introduced excessively into the oxide film, to form half metal/insulator/half metal junction and thus, create a MR effect therein.

5 Claims, 1 Drawing Sheet

METHOD FOR FABRICATING A MAGNETORESISTIVE FILM AND MAGNETORESISTIVE FILM

BACKGROUND OF THE INVENTION

1. Field of the Invention

This invention relates to a method for fabricating a magnetoresistive film and a magnetoresistive film, particularly preferably for a magnetic sensor and a magnetic head.

2. Description of the Prior Art

Recently, much attention is paid to a double perovskite type oxide ($A_2FeRO_6$: A=Sr, Ca, R=Mo, Re), particularly a poly crystalline oxide such as $Sr_2FeMoO_6$ or $Sr_2FeReO_6$ because the double perovskite type oxide can exhibit a relatively large magnetoresistive effect (MR effect) at room temperature. It is considered that the MR effect is originated from the tunnel barrier function of adjacent particles in the oxide.

In order to obtain such a MR effect in a thin film, such an attempt has been made as forming half metal/insulator/half metal junction. However, such a junction forming process requires a complicated process, so that the fabricating process for the thin film is increased and the process yield for the thin film is decreased.

SUMMARY OF THE INVENTION

It is an object of the present invention to provide a method for fabricating a new magnetoresistive film which can exhibit a MR effect easily and to provide the new magnetoresistive film.

For achieving the above object, this invention relates to a method for fabricating a magnetoresistive film, comprising the steps of:

preparing a single crystalline substrate, forming a double perovskite type oxide film on the single crystalline substrate, and oxidizing the oxide film in an oxygen-including atmosphere, thereby to introduce excess oxygen in the oxide film.

The inventors had intensely studied to develop a new magnetoresistive film which can exhibit a MR effect easily. As a result, they found out that when oxygen is excessively introduced into a double perovskite type oxide film to constitute a desired magnetoresistive film through oxidization, a half metal/insulator/half metal junction is created in the oxide film, so that the oxide film can exhibit a MR effect through the control in number of the conduction electrons in the oxide film.

According to the present invention, that is, one can create a MR effect in the oxide film by such an easy process as the introduction of excess oxygen through oxidization, and thus, obtain a desired magnetoresistive film.

A magnetoresistive film according to the present invention can be fabricated by means of the above-mentioned method, and is characterized by including a half metal/insulator/half metal junction through the excess oxygen, and including a double perovskite type oxide film.

Herein, the term "excess oxygen" means the one shifted from the stoichiometric amount of oxygen in the double perovskite type oxide film.

BRIEF DESCRIPTION OF THE DRAWINGS

For better understanding of the present invention, reference is made to the attached drawings, wherein.

DESCRIPTION OF THE PREFERRED EMBODIMENTS

Figure 1:
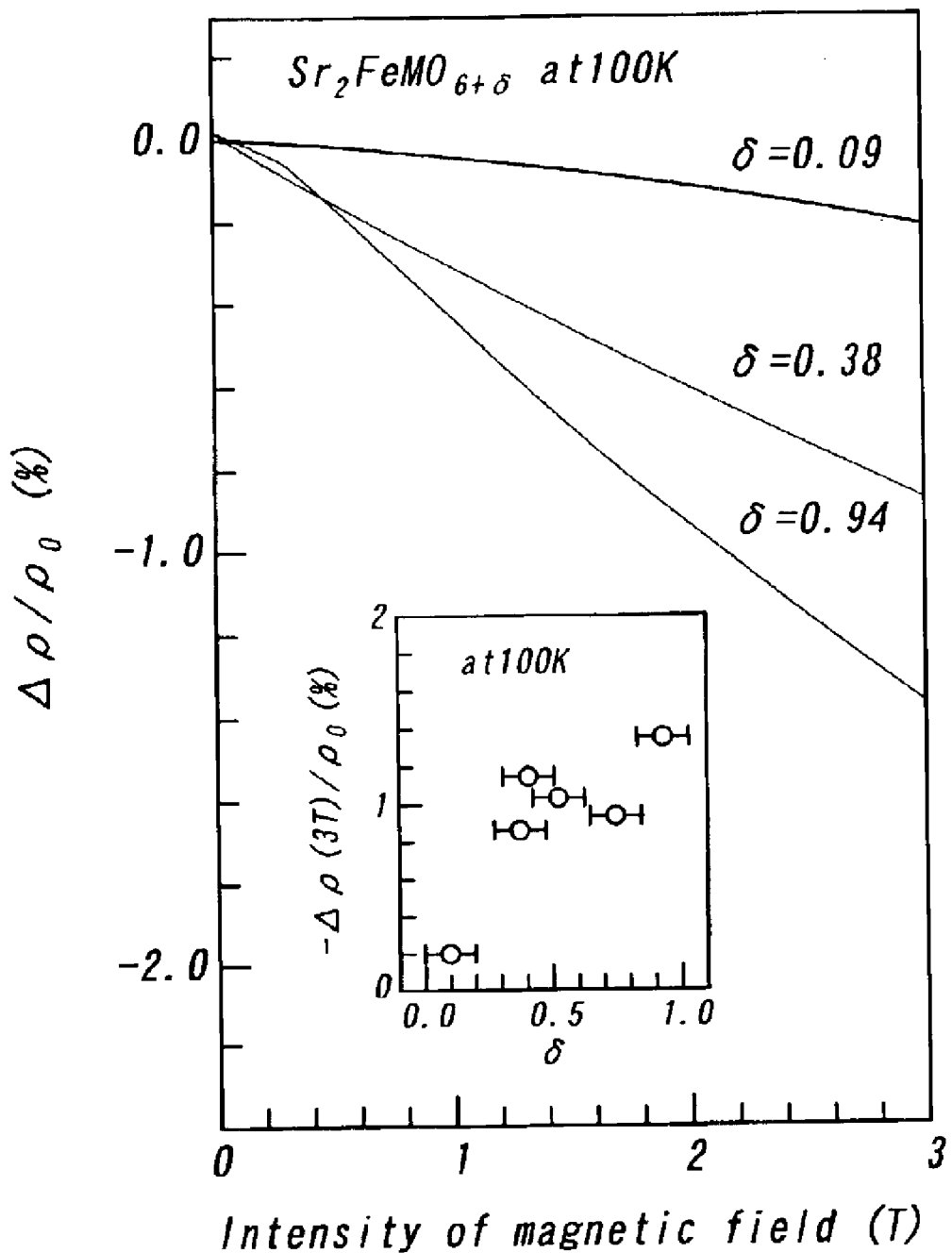
FIG. 1 is a graph showing the relation between the change in magnetic resistance of a magnetoresistive film according to the present invention and the intensity of applied magnetic field for the magnetoresistive film.

This invention will be described in detail with reference to the accompanying drawings.

First of all, in the present invention, a double perovskite type oxide film is formed on a given single crystalline substrate. A forming method for the oxide film is not restricted. For example, as the forming method are exemplified a thermal CVD method, a plasma CVD method, a MBE method, a laser MBE method and a sputtering method.

In order to enhance the growth of the oxide film, the substrate may be heated to a given temperature.

Then, the oxide film is set and then, oxidized in an oxygen-including atmosphere, so that excess oxygen is introduced into the oxide film. The oxidization can be preferably performed by heating the substrate to 300° C. or over, particularly within 300–500° C.

The oxidization can be preferably performed by the use of active oxygen radicals generated by the introduction of plasma without the heating of the substrate. Moreover, the oxidization can be preferably performed by the direct introduction of active oxygen atoms or oxygen molecules without the heating of the substrate.

The above-mentioned preferable oxidization can be employed independently or some of them can be combined. The heating of the substrate can be employed more preferably because the oxidation can be more easily performed through the heating of the substrate, and thus, the desired magnetoresistive film can be more easily fabricated.

The oxygen-including atmosphere may be directly formed from oxygen gas, ozone gas or oxygen-including gas such as $NO_2$ gas. Simply, the oxygen-including atmosphere may be formed from atmospheric air. In the latter case, the oxidization may be performed by heating the oxide film within the above-mentioned temperature range in the atmospheric air. In this case, the oxidation can be performed extremely easily to introduce excess oxygen in the oxide film.

The amount of excess oxygen is not restricted only if a half metal/insulator/half metal junction is formed in the oxide film to exhibit a MR effect therein. Preferably, the amount of excess oxygen is set to 30 atomic percentages or over, particularly within 30–90 atomic percentages for the amount of Fe contained in the oxide film. In this case, the half metal/insulator/half metal junction can be formed without fail, irrespective of the thickness and the sort of the oxide film, so that a sufficient MR effect can be obtained from the oxide film.

In the present invention, the double perovskite type oxide film can be represented as $A_2FeRO_6$ (A=Sr, Ca, R=Mo, Re). Preferably, the oxide film may be made of $Sr_2FeMoO_6$ or $Sr_2FeReO_6$. In the preferable case, the half metal/insulator/half metal junction can be formed without fail, to provide a magnetoresistive film having a sufficient MR effect in a good process yielding.

The substrate may be made of single crystalline oxide such as sapphire single crystal, ZnO single crystal, $LiAlO_2$ single crystal, $LiGaO_2$ single crystal, $MgAl_2O_4$ single crystal or MgO single crystal, IV single crystal such as Si single crystal, IV—IV single crystal such as SiC single crystal, II–V single crystal such as GaAs single crystal, AlN single crystal, GaN single crystal or AlGaN single crystal, or boronic single crystal such as $ZrB_2$.

In the case that the oxide film is made of $Sr_2FeMoO_6$ or $Sr_2FeReO_6$, the substrate may be preferably made of not expensive MgO single crystal.

EXAMPLE

The present invention will be described concretely on the basis of example, hereinafter.

First of all, a given (100) MgO single crystal was prepared as a substrate, and then, was set in a vacuum pulsed laser evaporation apparatus. Then, the substrate was heated to 700° C. The interior of the apparatus was maintained in a vacuum degree of $1×10^{-5}$ Torr or below. Then, an excimer laser beam with a wavelength of 248 nm, a frequency of 5 Hz and a pulse energy of 200 mJ was irradiated onto a $Sr_2FeMoO_6$ single crystal which was formed by means of melting zone method, to form a $Sr_2FeMoO_6$ film in a thickness of about 1 μm on the substrate through the evaporation of $Sr_2FeMoO_6$. The thickness was measured by means of cross sectional SEM observation. For the measurement of electric resistance for the $Sr_2FeMoO_6$ film, a terminal pattern for four probe measurement was formed on the $Sr_2FeMoO_6$ film. The distance of the adjacent patterns was set to 2 mm, and the line width of each pattern was set to 0.5 mm.

Then, the $Sr_2FeMoO_6$ film was set in a muffle furnace, and oxidized in an atmospheric air under the conditions listed in Table 1 so that excess oxygen can be introduced therein.

It was found out in a pre-experiment that the $Sr_2FeMoO_6$ film satisfies the relation of $d(Å)=1.97+0.00932δ$ when the lattice constant at (004) plane of the $Sr_2FeMoO_6$ film is set to $d(Å)$ and the amount of excess oxygen in the $Sr_2FeMoO_6$ film is set to $δ(at \%)$, which is obtained from elemental analysis and X-ray diffraction. In this point of view, the excess oxygen data listed in Table 1 were obtained as $δ$ from the above relation when X-ray diffraction was carried out for the $Sr_2FeMoO_6$ film and then, the lattice constant d was measured from the X-ray diffraction.

TABLE 1

| No. | Substrate-heating temperature T (° C.) | Period of oxidization t (min) | Amount of excess oxygen δ (at %) |
|---|---|---|---|
| No. 1 | As-grown | | 0.09 |
| No. 2 | 300 | 3 | 0.52 |
| No. 3 | 300 | 10 | 0.66 |
| No. 4 | 300 | 20 | 0.52 |
| No. 5 | 300 | 60 | 0.41 |
| No. 6 | 400 | 10 | 0.38 |
| No. 7 | 400 | 15 | 0.94 |
| No. 8 | 400 | 20 | 1.09 |
| No. 9 | 400 | 30 | 0.94 |
| No. 10 | 500 | 1 | 0.75 |

Comparing No. 2–5 with No. 6–9, the amount of excess oxygen tends to be increased as the heating temperature of the substrate is increased. Moreover, it was turned out that the $Sr_2FeMoO_6$ film includes excess oxygen slightly even as as-grown state without the oxidization through the heating of the substrate.

Then, the MR effects of No. 1, No. 6 and No. 7 were measured. The MR effect was defined as the decrease ratio in electric resistance at the application of magnetic field with an intensity of 3T for at the non-application of magnetic field as follows.

$$MR=Δρ/ρ0=(ρ(3T)-ρ(0T))/ρ(0T)$$

Herein, the MR measurement was carried out at 100K, and the electric resistance was measured by the four probe method. The resultant MR effect data were plotted in FIG. 1. As is apparent from FIG. 1, it was turned out that the absolute amount of the $Δρ/ρ0$ (=the change in magnetic resistance) is increased as the intensity of the magnetic field is increased, so that the resultant $Sr_2FeMoO_6$ films can exhibit their respective MR effects. Particularly, two samples among the $Sr_2FeMoO_6$ films, which include at least 30 atomic percentages of excess oxygen, have their respective large MR effects, so that if the two $Sr_2FeMoO_6$ films are employed, magnetoresistive films of good condition can be provided.

The inserted drawing in FIG. 1 is a graph showing the relation between the amount of excess oxygen and the $Δρ/ρ0$ at the application of magnetic field with an intensity of 3T. As is apparent from the inserted drawing, the $Δρ/ρ0$ is increased as the amount of excess oxygen is increased. In other words, the resultant $Sr_2FeMoO_6$ films can exhibit their respective good MR effects as the amount of excess oxygen is increased.

Although the present invention was described in detail with reference to the above examples, this invention is not limited to the above disclosure and every kind of variation and modification may be made without departing from the scope of the present invention.

As mentioned above, according to the present invention, a new method for fabricating a magnetoresistive film which can exhibit a MR effect sufficiently can be provided, and the resultant magnetoresistive film can be provided.

What is claimed is:

1. A method for fabricating a magnetoresistive film, comprising the steps of:

preparing a single crystalline substrate, forming a double perovskite type oxide film on said single crystalline substrate, and oxidizing said oxide film in an oxygen-including atmosphere, thereby to introduce excess oxygen in said oxide film.

2. The fabricating method as defined in claim 1, wherein said oxidation is performed under the condition that said substrate is heated at 300° C. or over.

3. The fabricating method as defined in claim 1, wherein said oxidization is performed under atmospheric air.

4. The fabricating method as define in claim 1, wherein the amount of said excess oxygen in said oxide film is set to at least 30 atomic percentages for the amount of Fe contained in said oxide film.

5. The fabricating method as defined in claim 1, wherein said oxide film is made of $Sr_2FeMoO_6$ or $Sr_2FeReO_6$.

* * * * *